United States Patent
Li et al.

(10) Patent No.: US 11,606,064 B2
(45) Date of Patent: Mar. 14, 2023

(54) FOURIER DOMAIN MODE-LOCKED OPTOELECTRONIC OSCILLATOR

(71) Applicant: INSTITUTE OF SEMICONDUCTORS, CHINESE ACADEMY OF SCIENCES, Beijing (CN)

(72) Inventors: Ming Li, Beijing (CN); Tengfei Hao, Beijing (CN); Jian Tang, Beijing (CN); Nuannuan Shi, Beijing (CN); Wei Li, Beijing (CN); Ninghua Zhu, Beijing (CN)

(73) Assignee: INSTITUTE OF SEMICONDUCTORS, CHINESE ACADEMY OF SCIENCES, Beijing (CN)

( * ) Notice: Subject to any disclaimer, the term of this patent is extended or adjusted under 35 U.S.C. 154(b) by 169 days.

(21) Appl. No.: 16/987,012

(22) Filed: Aug. 6, 2020

(65) Prior Publication Data

US 2021/0066875 A1    Mar. 4, 2021

(30) Foreign Application Priority Data

Aug. 30, 2019    (CN) .......................... 201910820922.X

(51) Int. Cl.
   *H03B 17/00*    (2006.01)
(52) U.S. Cl.
   CPC .................................... *H03B 17/00* (2013.01)
(58) Field of Classification Search
   CPC .................................. H03B 17/00; H01S 1/02
   (Continued)

(56) References Cited

U.S. PATENT DOCUMENTS

| 11,362,482 B2 * | 6/2022 | Li ........................ G02F 1/0123 |
| 2005/0123306 A1 * | 6/2005 | Ilchenko ............ G02B 6/29395 398/161 |
| 2020/0096417 A1 * | 3/2020 | Terra ..................... G01N 21/41 |

FOREIGN PATENT DOCUMENTS

| CN | 105576478 | 5/2016 |
| CN | 106936054 | 7/2017 |

(Continued)

OTHER PUBLICATIONS

First Chinese Office Action, issued in the corresponding Chinese application No. 201910820922.X, dated Jun. 1, 2020, 19 pages.

(Continued)

*Primary Examiner* — Richard Tan
(74) *Attorney, Agent, or Firm* — Hamre, Schumann, Mueller & Larson, P.C.

(57) ABSTRACT

A Fourier domain mode-locked optoelectronic oscillator includes a laser light source, a phase modulator, an optical notch filter, a photodetector, an electrical amplifier and a power divider; wherein the laser light source, the phase modulator, the optical notch filter and the photodetector together form a swept microwave photonic filter. The passband of the swept microwave photonic filter is determined by the difference in wavelength corresponding to the laser light source and the notch positions of the optical notch filter. In the present disclosure, the laser light source, the phase modulator, the optical notch filter, and the photodetector are configured to form a fast swept microwave photonic filter, the sweeping of a passband of the microwave photonic filter is realized by the sweeping of the laser light source or the optical notch filter, and the change in the filter's passband is matched with the latency for delivering a signal in the optoelectronic oscillator loop for one trip. As such, Fourier domain mode locking is realized, and a (Continued)

broadband adjustable chirped microwave signal can be output.

11 Claims, 5 Drawing Sheets

(58) Field of Classification Search
USPC .......................................................... 331/40
See application file for complete search history.

(56) References Cited

FOREIGN PATENT DOCUMENTS

| CN | 107342816 | 11/2017 |
| CN | 110707509 | 1/2020 |

OTHER PUBLICATIONS

Hao et al., Harmonically Fourier Domain Mode-Locked Optoelectronic Oscillator, Photonics Technology Letters, vol. 3, No. 6, Mar. 15, 2019, 4 pages.

* cited by examiner

FOURIER DOMAIN MODE-LOCKED OPTOELECTRONIC OSCILLATOR

CROSS-REFERENCE TO RELATED APPLICATION(S)

This application claims priority to the Chinese Patent Application No. 201910820922.x, filed on Aug. 30, 2019, entitled "FOURIER DOMAIN MODE-LOCKED OPTO-ELECTRONIC OSCILLATOR" which is incorporated herein by reference in its entirety.

TECHNICAL FIELD

The disclosure relates to the field of microwave photonics, in particular, to a Fourier domain mode-locked optoelectronic oscillator.

BACKGROUND

High-quality microwave signal sources can be realized by using microwave generating technology based on electronics or photonics. Among them, the electronic method may have a high precision, but a poor instantaneous bandwidth and a poor phase noise characteristics. In order to overcome the above shortcomings of the electronic methods, researchers have proposed a variety of microwave signal generating technologies based on photonics, mainly including a dual-wavelength laser heterodyne method, a optical pulse shaping method and a optoelectronic oscillation technology. Among them, the dual-wavelength laser heterodyne method can easily realize the generation of broadband and fast-tuned chirped microwave signals by adjusting the wavelength of the laser, and the characteristics in the terms of bandwidth and chirping speed are significantly better than that of the electronic method. However, due to the poor phase coherence of two lasers, the phase noise of the generated microwave signal is large, or even worse than that of a voltage controlled oscillator. Microwave signal generating technology based on optical pulse shaping is mainly based on the principle of frequency-to-time mapping. By shaping the frequency domain of the optical spectrum, a microwave signal with arbitrary waveform can be generated. The main problem faced by this technology is the slow reconstruction speed and the requirement to reshape the spectrum. In addition, due to a low precision of spectrum shaping, the phase noise of the generated microwave signal is large.

The optoelectronic oscillating technology can overcome the deficiencies of the above two methods, construct a high-performance resonant cavity with the optical energy storage technology, and generate a microwave signal with ultra-low phase noise. Since this concept was proposed by X. S. Yao etc. from the Jet Propulsion Laboratory in 1996, it has been widely concerned. The phase noise of a high-quality optoelectronic oscillator reported by American OEwaves Inc. is as low as −160 dBc/Hz@10 kHz. The optoelectronic oscillator may also have a good tunability. The currently reported tunable range of the optoelectronic oscillator can cover tens of GHz. However, during the frequency tuning process, an oscillation with a new frequency should be re-oscillated from noise and stabilized to a steady state, which limits the frequency tuning speed significantly. On the other hand, since the new oscillation mode is re-established from noise, it may have a phase which is separated from the phase of the previous oscillation mode or irrelevant with it, which means that the phase noise of the microwave signal will increase significantly during the frequency tuning process.

SUMMARY

In view of this, the main object of the present disclosure is to provide a Fourier domain mode-locked optoelectronic oscillator, so as to at least partially solve one of the technical problems mentioned above.

In order to achieve the above object, the present disclosure provides a Fourier domain mode-locked optoelectronic oscillator, including: a laser light source, a phase modulator, an optical notch filter, a photodetector, an electrical amplifier and a power divider;

wherein the laser light source is configured to emit an optical signal, the phase modulator is configured to modulate the optical signal so as to form a carrier wave and two modulated sidebands, the optical notch filter is configured to suppress one of the modulated sidebands so as to output the carrier wave and the other sideband unsuppressed, and the photodetector is configured to receive the carrier wave and the other sideband and restore an electric signal having a corresponding frequency by beating the carrier wave with the other sideband;

wherein a detecting frequency of the photodetector, a light emitting frequency of the laser light source, or a frequency of the optical notch filter is configured to be tuned periodically so that a change in a passband of the microwave photonic filter is matched with a latency for delivering the optical and microwave signal in a loop of the optoelectronic oscillator for one trip, thereby enabling the oscillating signal to be Fourier domain mode locked;

wherein the photodetector, the electrical amplifier, the power divider, and the phase modulator are sequentially coupled by a cable, and a chirped microwave signal is output by the power divider;

wherein the laser light source, the phase modulator, the optical notch filter and the photodetector constitute a swept microwave photonic filter together.

In a further embodiment, the swept microwave photonic filter has a center frequency equal to a difference between a center frequency of an optical carrier of the laser light source and a center frequency of the optical notch filter, the microwave photonic filter is configured to perform a frequency sweeping by sweeping the frequency of the laser light source or the optical notch filter.

In a further embodiment, the phase modulator, the optical notch filter, and the photodetector are coupled by a fiber patch cord, and the optical fiber is configured as a microwave energy storage element.

In a further embodiment, the laser light source is a swept laser, or a single-sideband modulated swept light source driven by a microwave signal, or a single frequency laser, so as to generate the optical carrier.

In a further embodiment, the optical notch filter is a phase-shifted fiber Bragg grating, or a micro-ring resonator, or an optical filter based on the stimulated Brillouin scattering effect, so as to filter out one of the modulated sidebands.

In a further embodiment, the change in the passband of the microwave photonic filter is matched with a latency for delivering the optical and microwave signal in the loop of the optoelectronic oscillator for one trip, thereby satisfying the Fourier domain mode-locked condition that:

$$nT = T_r;$$

wherein, n is a positive integer, T is a change period for the microwave photonic filter, and $T_r$ is the latency for delivering the optical and microwave signal in the loop of the optoelectronic oscillator for one trip.

In a further embodiment, a time-frequency variation of the chirped microwave signal output by the Fourier domain mode-locked optoelectronic oscillator is controlled by the swept microwave photonic filter, and the chirped microwave signal is continuous in phase;

preferably, the Fourier domain mode-locked optoelectronic oscillator is configured to output the chirped microwave signal with a tunable bandwidth, which has a chirped center frequency tuned by controlling the center frequency of the laser light source or the optical notch filter, and a chirped width tuned by controlling a change range of the frequency of the laser light source or the optical notch filter.

In a further embodiment, the swept microwave photonic filter further comprises an optical amplifier for amplifying the optical signal, so as to promote the starting of oscillation.

In a further embodiment, the positions of the power divider and the electrical amplifier in the Fourier domain mode-locked optoelectronic oscillator are exchangeable with each other;

preferably, the phase modulator is replaced with a polarization modulator.

In a further embodiment, the optoelectronic oscillator is a single loop optoelectronic oscillator, or a double loop optoelectronic oscillator, or a multi-loop optoelectronic oscillator. Based on the above technical solution, the Fourier domain mode-locked optoelectronic oscillator of the present disclosure may have following advantages over the prior art:

(1) It can generate chirped microwave signals with a tunable frequency band, a low phase noise and a continuous phase;

(2) The tuning speed of the microwave photonic filter of the present disclosure depends on the frequency tuning speed of the laser light source or the optical notch filter, and can realize the tuning speed in the order of MHz or even faster. The chirping range is mainly determined by the dynamic frequency tuning range of the laser light source or the optical notch filter, and can reach to several tens of GHz. Therefore, the Fourier domain mode-locked optoelectronic oscillator of the present disclosure can output a broadband fast-chirped microwave signal;

(3) The microwave photonic filter of the present disclosure may have a passband determined by the difference between frequencies corresponding to the light emission wavelength of the laser light source and the notch position of the optical notch filter, a chirping center frequency tuned by controlling the center frequency of the laser light source or the optical notch filter, and a chirping width tuned by controlling the frequency change range of the laser light source or the optical notch filter. Therefore, the output chirped signal of the Fourier domain mode-locked optoelectronic oscillator of the present disclosure is tunable;

(4) The signals with different frequency components pass through the microwave photonic filter at different times, and those frequency components are stored in the ring cavity of the optoelectronic oscillator at the same time. As a result, the new frequency component does not need to restart to oscillate from noise, so that the Fourier domain mode-locked optoelectronic oscillator of the present disclosure can output chirped microwave signals with continuous phase.

Figure 1:
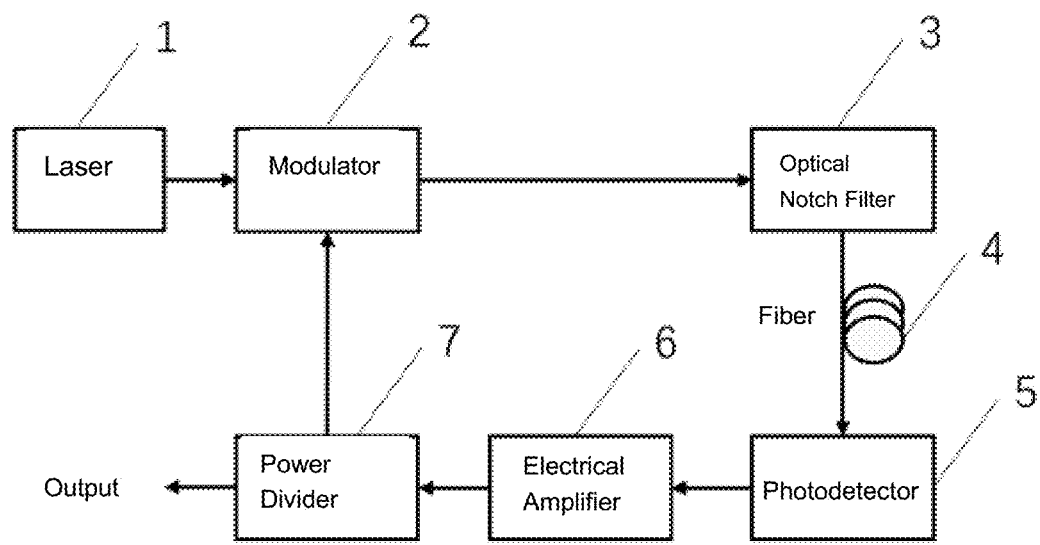
FIG. 1 is a schematic structural diagram of a Fourier domain mode-locked optoelectronic oscillator according to an embodiment of the present disclosure.

In the above drawings, the reference signs have the following meanings:

1—Laser Light Source
2—Phase Modulator
3—Optical Notch Filter
4—Optical Fiber
5—Photodetector
6—Electrical Amplifier
7—Power Divider
1a—Laser Driver
1b—Swept Laser
1c—Single Sideband Modulator
1d—Swept Microwave Source
1e—Single Frequency Laser
3a—Optical Filter Driver
3b—Swept Optical Notch Filter
21—the first frequency of the microwave photonic filter
22—the second frequency of the microwave photonic filter
23—the third frequency of the microwave photonic filter

DETAILED DESCRIPTION

In order to make the objectives, technical solutions and advantages of the present disclosure clearer and more obvious, the present disclosure is described in further detail below with reference to the accompanying drawings in combination with specific embodiments.

In order to meet the demands for high-quality and fast-chirped microwave signal sources in communication and radar systems, the present disclosure proposes a Fourier-domain mode-locked optoelectronic oscillator for generating a fast-chirped microwave signal with adjustable broadband. The disclosure discloses a Fourier domain mode-locked optoelectronic oscillator, which generates a fast-chirped microwave signal with adjustable broadband by utilizing the laser emission characteristics of a laser light source, the modulation characteristics of a phase modulator, the filtering characteristics of an optical notch filter, the photoelectric conversion characteristics of a photodetector, and the microwave generating characteristics of the optoelectronic oscillator.

Specifically, the Fourier domain mode-locked optoelectronic oscillator of the present disclosure mainly includes: a laser light source, a phase modulator, an optical notch filter, a photodetector, an electrical amplifier and a power divider.

The photodetector, the electrical amplifier, the power divider, and the phase modulator are connected by a cable.

The laser light source, the phase modulator, the optical notch filter and the photodetector constitute a swept microwave photonic filter together. The passband of the swept microwave photonic filter is determined by a difference between a wavelength of the laser light source and that of the optical notch filter corresponding to a notch position thereof. The sweeping of the microwave photonic filter is realized by the sweeping of the laser light source or the optical notch filter.

The laser light source, the phase modulator, the optical notch filter, and the photodetector may be connected by an optical fiber cord.

The optical fiber may be a low-loss energy storage element.

The laser light source is a swept laser, a single-sideband modulated swept light source driven by a microwave signal, or a single frequency laser, and the laser light source is configured to generate an optical carrier.

The optical notch filter is a phase-shifted fiber Bragg grating with a bandwidth as low as tens of MHz, a micro-ring resonator, or an optical filter based on stimulated Brillouin scattering effect, and the optical notch filter is configured to filter out one of the phase modulated sidebands.

The change period of the swept microwave photonic filter is matched with a latency for delivering the optical and microwave signal in the loop of the optoelectronic oscillator for one trip, thereby satisfying the Fourier domain mode-locked condition that:

$$nT=T_r;$$

wherein n is a positive integer, T is a change period for the microwave photonic filter, and $T_r$ is the latency for delivering the optical and microwave signal in the loop of the optoelectronic oscillator for one trip.

A time-frequency variation of the chirped microwave signal output by the Fourier domain mode-locked optoelectronic oscillator is controlled by the swept microwave photonic filter, and the chirped microwave signal is continuous in phase.

The Fourier domain mode-locked optoelectronic oscillator is configured to output the chirped microwave signal with a tunable bandwidth, which has a chirped center frequency tuned by controlling the center frequency of the laser light source or the optical notch filter, and a chirped width tuned by controlling a change range of the frequency of the laser light source or the optical notch filter.

The swept microwave photonic filter further comprises an optical amplifier for amplifying the optical signal, so as to promote the starting of oscillation.

In the Fourier domain mode-locked optoelectronic oscillator, the positions of the power divider and the electrical amplifier are exchangeable with each other;

The phase modulator is replaced with a polarization modulator.

The optoelectronic oscillator may be a single loop optoelectronic oscillator, or a double loop optoelectronic oscillator, or a multi-loop optoelectronic oscillator.

The principle of the Fourier domain mode-locked optoelectronic oscillator of the present disclosure is as follows: the optical signal emitted by a laser light source is modulated by a phase modulator and then passes through an optical notch filter which filters out one of the phase modulated sidebands, thereby converting the phase modulation into an amplitude modulation. As a result, a microwave signal corresponding to a difference between the light emitting frequency of the laser light source and a frequency of the optical notch filter corresponding to the notch position thereof can be obtained in the photodetector. Therefore, the laser light source, the phase modulator, the optical notch filter and the photodetector together constitute a microwave photonic filter, and the passband of the filter is determined by the difference between a frequency of the tunable laser and a frequency of the optical notch filter corresponding to the notch position thereof. By periodically adjusting the light emission frequency of the laser light source or the notched frequency of the optical notch filter, that is, periodically tuning the passband of the microwave photonic filter and matching the change of the passband of the filter with a latency for delivering a signal in the optoelectronic oscillator loop for one trip, Fourier domain mode locking may be realized. Microwave signals of different frequencies oscillate in the cavity at the same time, and a fast-chirped microwave signal can be obtained at the output terminal.

The technical solution of the present disclosure will be further described and explained below in conjunction with the drawings and specific embodiments.

FIG. 1 illustrates a schematic structural diagram of a Fourier domain mode-locked optoelectronic oscillator of the present disclosure. The Fourier domain mode-locked optoelectronic oscillator mainly includes: a laser light source 1, a phase modulator 2, an optical notch filter 3, an optical fiber 4, an photodetector 5, an electrical amplifier 6 and a power divider 7. The laser light source 1, the phase modulator 2, the optical notch filter 3, the optical fiber 4, and the photodetector 5 are connected by a fiber patch cord, and the photodetector 5, the electrical amplifier 6, the power divider 7, and the phase modulator 2 are connected by a cable.

Figure 2:
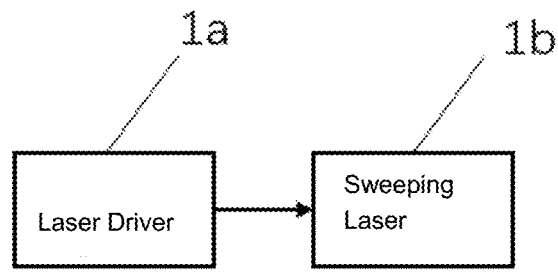
FIG. 2 is a structural diagram of a laser light source according to an embodiment of the present disclosure.

The optical signal emitted by the laser light source enters the phase modulator to be phase modulated. The modulated signal contains a carrier wave and two modulated sidebands. It can be seen from the characteristics of the phase modulation that the beating signals of the carrier wave and the two modulated sidebands may cancel each other out, resulting in that the microwave signal cannot be restored in the photodetector. If one of the modulated sidebands falls into the optical notch filter, it will be suppressed. In this case, the microwave signal of a corresponding frequency can be restored by beating the carrier wave and the other modulated sideband in the photodetector. This constitutes an equivalent microwave photonic filter, which has a bandpass transmission response. The center frequency of the microwave photonic filter is equal to a difference between the center frequencies of the optical carrier wave of the laser light source and the optical notch filter. Therefore, by rapidly changing the wavelength of an optical carrier wave emitted from the laser light source, a rapidly tuned microwave photonic filter can be realized. As shown in FIG. 2, the laser light source of the present disclosure includes a laser driver and a swept laser. The swept laser can be a distributed feedback (DFB) laser or a distributed Bragg reflection (DBR) laser, whose light emission frequency can be quickly tuned by changing the concentration of carriers in the laser cavity with a periodic driving current. Therefore, the passband of the microwave photonic filter can also be tuned quickly.

Figure 3:
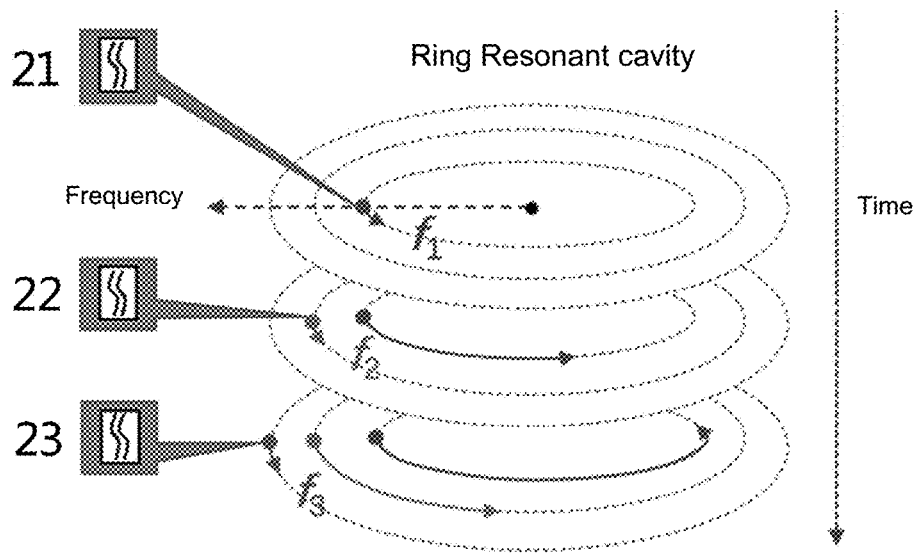
FIG. 3 is a diagram illustrating the principle for Fourier domain mode locking of the present disclosure.

The Fourier domain mode-locking condition of the present disclosure is that the tuning period of the fast tunable microwave photonic filter is synchronized with the latency for delivering a signal in the ring cavity of the optoelectronic oscillator for one trip, that is:

$$nT=T_r;$$

wherein, n is a positive integer, T is the change period for the microwave photonic filter, and $T_r$ is the latency for delivering a signal in the optoelectronic oscillator loop for one trip. As shown in FIG. 3, when the fast tunable microwave photonic filter is tuned to the first frequency 21, the optoelectronic oscillator generates a signal with a frequency $f_1$, and the signal with the frequency $f_1$ continues to be transmitted in the ring resonator. Then the filter is tuned to a second frequency 22 and a third frequency 23 respectively, and signals with a frequency $f_2$ and $f_3$ are generated correspondingly. When the signal with the frequency $f_1$ is delivered for exactly one trip, the filter is just tuned to the first frequency 21, enabling the signal with the frequency $f_1$ to pass through the filter smoothly and continue in resonating in the cavity. Similarly, when the signals with the frequencies $f_2$ and $f_3$ return to the starting point after being delivered for one trip, the filter is just tuned to a position such that the signals with the frequencies $f_2$ and $f_3$ resonate successfully in the cavity without disappearing. That is to say, microwave signals of different frequencies oscillate in the cavity at the same time, and the microwave signals output at different times have different frequencies, which depend on the center frequency of the fast tunable filter. As a result, a chirped microwave signal is generated. In the process of frequency chirping, microwave signals of different frequencies do not need to go through the process of being established from noise and then stabilizing to a steady state, thus the chirping speed is very high. The time-frequency variation of the chirped signal is also controlled by the fast tunable filter. Since the chirped signal is continuous in phase, it may greatly reduce the phase noise during the chirping process. Therefore, it is possible to generate fast chirped microwave signals with low phase noise and a broad band. The chirped output signal is tunable. In particular, the chirping center frequency can be adjusted by controlling the center light emission wavelength of the swept laser with a drive current. The chirping width can also be adjusted by controlling the change range of the drive current of the laser.

Figure 4:
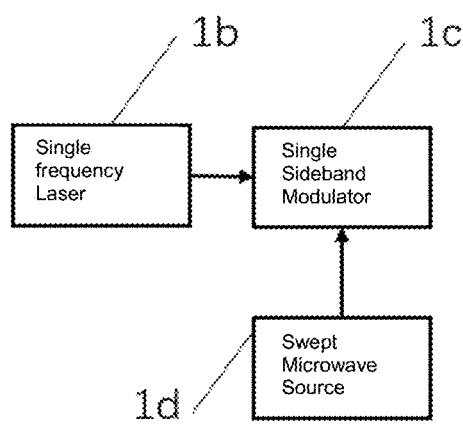
FIG. 4 is a structural diagram of a laser light source according to another embodiment of the present disclosure.

Based on the foregoing analysis for the Fourier domain mode-locked optoelectronic oscillator, in other optional embodiments, as shown in FIG. 4, the above-mentioned laser light source may include a single-frequency laser 1b, a single sideband modulator 1c, and a swept microwave source 1d. The single-frequency laser 1b is configured to generate a single-frequency optical carrier wave. The microwave signal emitted from the swept microwave source 1d is modulated onto the optical carrier wave by a single-sideband modulator 1c, so as to form a swept optical output.

The difference between this embodiment and the one shown in FIG. 2 is that the swept light source in this embodiment is realized by a single-sideband modulation driven by a swept microwave signal, wherein the laser is a single-frequency laser, and the laser in the embodiment shown in FIG. 2 directly generates a swept optical signal due to the periodic driving signal.

Figure 5:
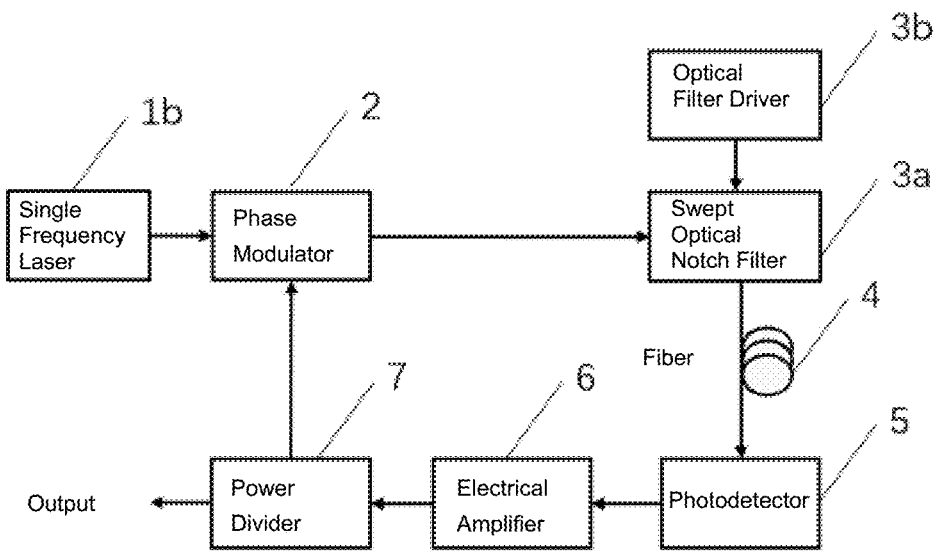
FIG. 5 is a schematic structural diagram of a Fourier domain mode-locked optoelectronic oscillator according to another embodiment of the present disclosure.

In some optional embodiments, as shown in FIG. 5, the above Fourier domain mode-locked optoelectronic oscillator may include: a single-frequency laser 1b, a phase modulator 2, a swept optical notch filter 3a, an optical filter driver 3b, an optical fiber 4, a photodetector 5, an electrical amplifier 6, and a power divider 7. Among them, the single-frequency laser 1b, the phase modulator 2, the swept optical notch filter 3a and the optical fiber 4 are connected, and the swept optical notch filter 3a and the optical filter driver 3b are connected. The optical carrier wave of a single frequency emitted from the single frequency laser 1b and the passband of the swept optical notch filter 3a change periodically under the action of the optical filter driver 3b.

In this embodiment, the single-frequency laser 1b, the phase modulator 2, the swept optical notch filter 3a, and the photodetector 5 constitute a swept microwave photonic filter together. The passband of the microwave photonic filter is equal to the difference between the light emission frequency of the single-frequency laser and the frequency of the optical notch filter. The sweeping of the microwave photonic filter is achieved by the sweeping of the optical notch filter. If the Fourier domain mode locking condition is satisfied, a broadband adjustable chirped microwave signal can be generated.

The above-mentioned modules may be realized with well-known functional modules. In addition, the above definitions for respective elements and methods are not limited to various specific structures, shapes, or modes mentioned in the embodiments, and those skilled in the art can make various changes with no efforts. For example, the positions of the power divider and the electrical amplifier may be interchanged. As another example, the phase modulator may be replaced with a polarization modulator. As a further example, the swept microwave photonic filter may be replaced with a swept electrical filter. As a further example, an optical amplifier may be added to the loop so as to amplify the signal. As a further example, the single loop structure may be replaced with a multiple loop structure. The number, shapes and sizes of the devices shown in the figures can be modified according to the actual application, and the configurations of the devices may be more complicated.

The present disclosure will be described in detail below in connection with a test instance with reference to FIGS. 6-9.

Figure 6:
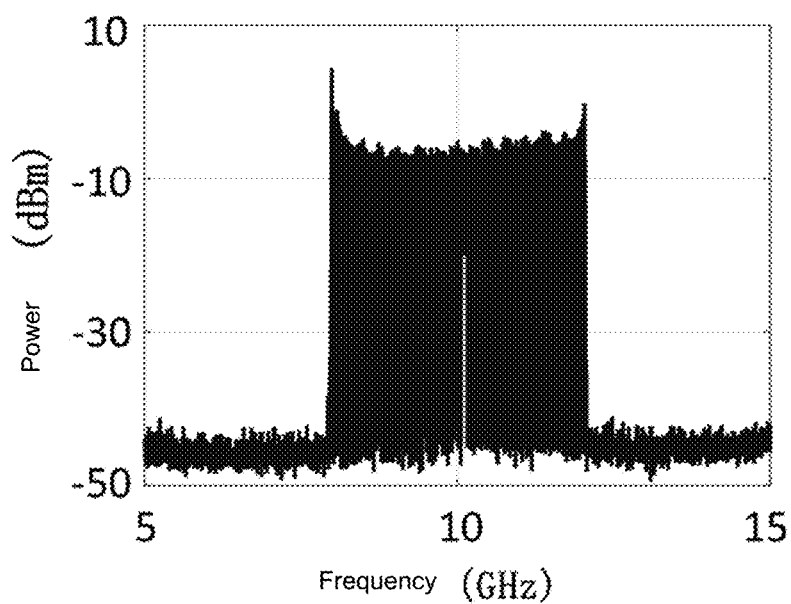
FIG. 6 is a schematic diagram illustrating a frequency spectrum of an 8-12 GHz chirped microwave signal which is output under a 10 GHz testing range according to an embodiment of the present disclosure.
Figure 7:
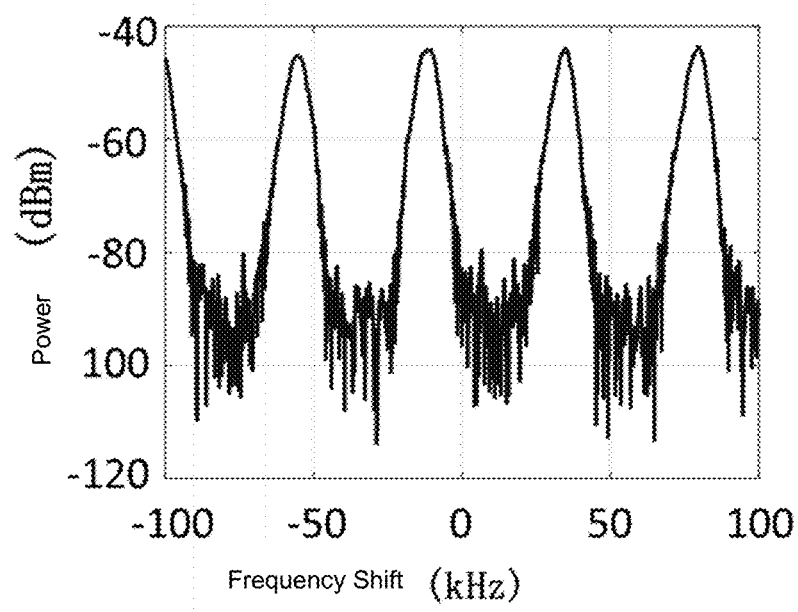
FIG. 7 is a schematic diagram illustrating a frequency spectrum of an 8-12 GHz chirped microwave signal which is output under a 200 kHz testing range according to an embodiment of the present disclosure.

FIG. 6 and FIG. 7 exemplarily show the spectrum diagrams of X-band chirped microwave signal which is output under different test ranges of the Fourier domain mode-locked optoelectronic oscillator. Among them, FIG. 6 is the spectrum that is measured when the test range is 10 GHz. It can be seen from FIG. 6 that the bandwidth of the output swept signal of the Fourier domain mode-locked optoelectronic oscillator can cover 8-12 GHz, that is, the entire X-band. FIG. 7 is the spectrum that is measured when the test range is 200 kHz and the center test frequency is 10 GHz, which is the same as that in FIG. 6. It can be seen that the modes of different frequencies of the optoelectronic oscillator oscillate in the cavity at the same time. Therefore, under the Fourier domain mode locking condition, microwave signals of different frequencies do not need to undergo the process of being established from noise and then stabilized to a steady state.

Figure 8:
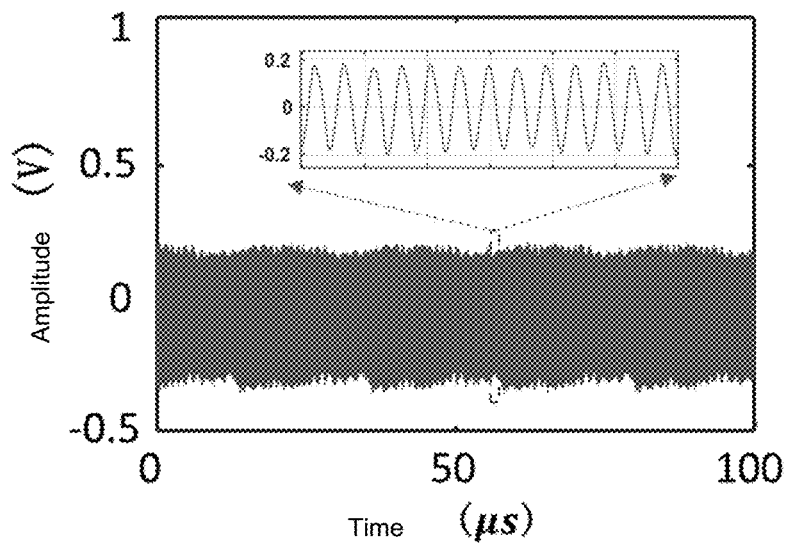
FIG. 8 is a schematic diagram illustrating a time-domain waveform of the output 8-12 GHz chirped microwave signal according to an embodiment of the present disclosure.
Figure 9:
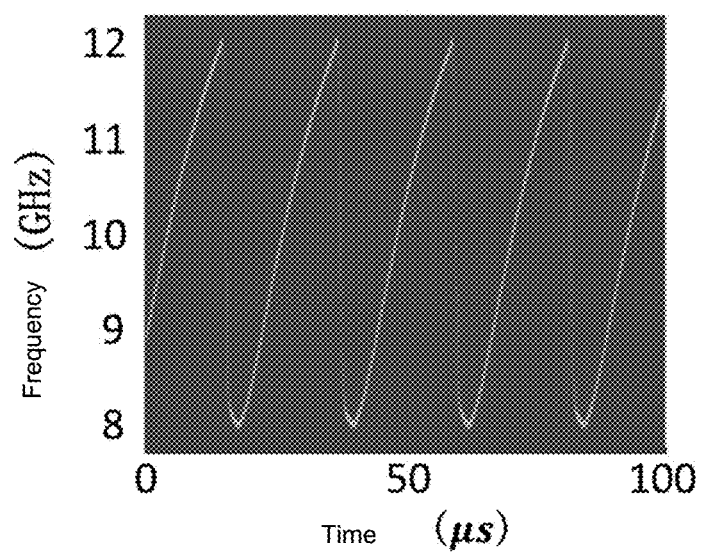
FIG. 9 is a schematic diagram illustrating an instantaneous frequency of the output 8-12 GHz chirped microwave signal according to an embodiment of the present disclosure.

FIGS. 8 and 9 exemplarily show the time-domain waveform diagram and instantaneous frequency diagram of the output signal of the Fourier domain mode-locked optoelectronic oscillator respectively. Among them, FIG. 8 is a time-domain waveform diagram of the X-band chirped microwave signal output by the Fourier domain mode-locked optoelectronic oscillator. The inset in FIG. 8 shows a schematic partial enlargement diagram of the dotted frame. The amplitude of the output chirped microwave signal has only small fluctuations, and its phase is continuous. FIG. 9 is a diagram showing the instantaneous frequency of the chirped microwave signal which is calculated by using short-time Fourier transform based on the time domain information in FIG. 8. It can be seen that within one chirp period, the frequency of the output signal increases approximately linearly from 8 GHz to 12 GHz. Therefore, the embodiments of the present disclosure can obtain a broadband chirped microwave signal with a continuous phase by using the above technical solution.

The purposes, technical solutions and beneficial effects of the present disclosure are further described in detail in connection with the above specific embodiments. It should be understood that the above description is only to illustrate specific embodiments of the present disclosure and is not intended to limit the present disclosure. All the modifications, equivalent replacements, improvements, etc. within the spirit and principle of the present disclosure shall be included in the protection scope of the present disclosure.

We claim:

1. A Fourier domain mode-locked optoelectronic oscillator comprising: a laser light source, a phase modulator, an optical notch filter, a photodetector, an electrical amplifier and a power divider;
   wherein the laser light source is configured to emit an optical signal, the phase modulator is configured to modulate the optical signal so as to form a carrier wave and two modulated sidebands, the optical notch filter is configured to suppress one of the modulated sidebands so as to output the carrier wave and the other sideband unsuppressed, and the photodetector is configured to receive the carrier wave and the other sideband and restore an electric signal having a corresponding frequency by beating the carrier wave with the other sideband;
   wherein a detecting frequency of the photodetector, a light emitting frequency of the laser light source, or a frequency of the optical notch filter is configured to be tuned periodically so that a change in a passband of a swept microwave photonic filter is matched with a latency for delivering the optical and microwave signal in a loop of the optoelectronic oscillator for one trip, thereby enabling the oscillating signal to be Fourier domain mode locked;
   wherein the photodetector, the electrical amplifier, the power divider, and the phase modulator are sequentially coupled by a cable, and a chirped microwave signal is output by the power divider;
   wherein the laser light source, the phase modulator, the optical notch filter and the photodetector constitute the swept microwave photonic filter together.

2. The Fourier domain mode-locked optoelectronic oscillator of claim 1, wherein the swept microwave photonic filter has a center frequency equal to a difference between a center frequency of an optical carrier of the laser light source and a center frequency of the optical notch filter, the swept microwave photonic filter is configured to perform a frequency sweeping by sweeping the frequency of the laser light source or the optical notch filter.

3. The Fourier domain mode-locked optoelectronic oscillator of claim 1, wherein the phase modulator, the optical notch filter, and the photodetector are coupled by a fiber patch cord, and an optical fiber is configured as a microwave energy storage element.

4. The Fourier domain mode-locked optoelectronic oscillator of claim 1, wherein the laser light source is a single-sideband modulated swept light source driven by a microwave signal, or a single frequency laser, so as to generate an optical carrier.

5. The Fourier domain mode-locked optoelectronic oscillator of claim 1, wherein the optical notch filter is a phase-shifted fiber Bragg grating, or a micro-ring resonator, or an optical filter based on stimulated Brillouin scattering effect, so as to filter out one of the modulated sidebands.

6. The Fourier domain mode-locked optoelectronic oscillator of claim 1, wherein the change in the passband of the swept microwave photonic filter is matched with a latency for delivering the optical and microwave signal in the loop of the optoelectronic oscillator for one trip, thereby satisfying the Fourier domain mode-locked condition that:

$$nT=T_r;$$

wherein n is a positive integer, T is a change period for the swept microwave photonic filter, and $T_r$ is the latency for delivering the optical and microwave signal in the loop of the optoelectronic oscillator for one trip.

7. The Fourier domain mode-locked optoelectronic oscillator of claim 1, wherein a time-frequency variation of the chirped microwave signal output by the Fourier domain mode-locked optoelectronic oscillator is controlled by the swept microwave photonic filter, and the chirped microwave signal is continuous in phase;
   preferably, the Fourier domain mode-locked optoelectronic oscillator is configured to output the chirped microwave signal output with a tunable bandwidth, which has a center frequency tuned by controlling a center frequency of the laser light source or the optical notch filter, and a width tuned by controlling a change range of the frequency of the laser light source or the optical notch filter.

8. The Fourier domain mode-locked optoelectronic oscillator of claim 1, wherein the swept microwave photonic filter further comprises an optical amplifier for amplifying the optical signal, so as to promote starting of oscillation.

9. The Fourier domain mode-locked optoelectronic oscillator of claim 1, wherein the positions of the power divider and the electrical amplifier in the Fourier domain mode-locked optoelectronic oscillator are exchangeable with each other;
   preferably, the phase modulator is replaced with a polarization modulator.

10. The Fourier domain mode-locked optoelectronic oscillator of claim 1, wherein the optoelectronic oscillator is a single loop optoelectronic oscillator, or a double loop optoelectronic oscillator, or a multi-loop optoelectronic oscillator.

11. The Fourier domain mode-locked optoelectronic oscillator of claim 1, wherein the laser light source is a swept laser, so as to generate an optical carrier.

* * * * *